US005483882A

United States Patent [19]
Jaffa

[11] Patent Number: 5,483,882
[45] Date of Patent: Jan. 16, 1996

[54] SCREEN ADJUSTMENT AND RESET DEVICE FOR PRINTING APPARATUS AND THE LIKE

[75] Inventor: David Jaffa, Franklin Lakes, N.J.

[73] Assignee: Precision Screen Machines, Inc., Glen Ellyn, Ill.

[21] Appl. No.: 156,422

[22] Filed: Nov. 23, 1993

[51] Int. Cl.$^6$ ................................................. B41F 15/34
[52] U.S. Cl. .................. 101/128; 101/129; 101/DIG. 36; 101/127.1; 101/127
[58] Field of Search ..................................... 101/126, 127, 101/127.1, 128, 128.1, 128.4, 129, 112, DIG. 36

[56] References Cited

U.S. PATENT DOCUMENTS

| | | | |
|---|---|---|---|
| 3,943,851 | 3/1976 | Inada et al. | 101/127.1 |
| 4,993,166 | 2/1991 | Bradley | 101/DIG. 36 |
| 5,111,743 | 5/1992 | Umaba et al. | 101/127 |
| 5,189,951 | 3/1993 | Webster et al. | 101/128.1 |
| 5,226,366 | 7/1993 | Schlife et al. | 101/DIG. 36 |
| 5,315,929 | 5/1994 | Sundqvist | 101/127.1 |

Primary Examiner—Ren Yan
Assistant Examiner—Lynn D. Hendrickson
Attorney, Agent, or Firm—Hopgood, Calimafde, Kalil & Judlowe

[57] ABSTRACT

This invention relates to a device, a system and a method for locating a printing screen at a selected starting position for printing operations and for resetting the screen to the starting position for its adjustment relative to an article. The device includes first and second centering plates disposed in overlapping relationship to one another. The plates are mounted to respective first and second moveable screen support members. At least one micro-adjuster is associated with each support member for effecting precise adjustment of the respective centering plates and, hence, the screen. A first micro-adjuster effects longitudinal movement of the first member and a second effects movement of the second member laterally. Thereby, planar movement of the screen and the associated centering plates is effected. The device also has an arm with an aperture for receiving and engaging a screen centering member. The member passes through the aperture and into engagement with a corresponding receptacle in the screen. Micro-adjusters associated with the support members are then manipulated so as to place the screen in precise registration with the article. A hole is made in each of the first and second plates at a location where the plates overlap. Upon passing a pin through the holes, the starting or reset position for screen adjustment is defined.

3 Claims, 10 Drawing Sheets

SCREEN ADJUSTMENT AND RESET DEVICE FOR PRINTING APPARATUS AND THE LIKE

BACKGROUND OF THE INVENTION

The present invention relates to printing apparatus, and more particularly to a device and method which both expedites and facilitates printing of quality images.

The printing of images on articles (such as sheets of textiles, plastic or the like) is commonly accomplished by screen printing machines. Generally, these machines are provided with a conveyorized mechanism such as a printing blanket. The article is placed flat on the blanket and indexed to a printing station. A printing head is then lowered onto the article and a printing operation is performed. For example, a print squeegee is stroked across the surface of a horizontal screen in registry with the article so as to force printing ink through the screen and onto the article, thereby effecting printing.

To assure quality, it has been found desirable to position the printing head and, more particularly, the screen into precise registration with the article upon each printing operation. Precise registration has been found inhibited, however, by manufacturing imperfections in the screens as well as temperature variations during printing, particularly those causing expansion and contraction of the screen.

To compensate, micro-registration devices have been used to adjust the screens (along their X-Y axes) into precise registration with the article. To effect these adjustments, it was often necessary to halt printing operations. After changing articles or designs, it also became necessary to reposition the screen. Either way, a time-consuming process was needed which involved back and forth, iterative adjustments to both ends of the screen. An objective was to insure that the screen was in precise registration with the article upon each step of the printing operation.

Although devices with reference lines, calibration gauges or centering targets have been used in an effort to simplify this task, i.e., zero or reset the screen to a selected starting position prior to adjustment, they have been found inherently inaccurate for use in many printing applications. In particular, alignment of these devices has been found to vary not only with the position from which they are viewed, but also with temperature fluctuations during printing. They have also been found lacking in reset capability and ready alignment of both ends of the screen, delaying both set-up and production of printed articles.

SUMMARY OF THE INVENTION

In accordance with one aspect of the present invention, there is provided a device for locating a printing screen at a selected starting position for printing operations and for resetting the screen to the starting position for its adjustment relative to an article. The device includes first and second centering plates disposed in overlapping relationship to one another. The plates are mounted to respective first and second moveable screen support members. At least one micro-adjuster is associated with each support member for effecting precise adjustment of the respective centering plates and, hence, the screen. A first micro-adjuster effects longitudinal movement of the first member and a second effects movement of the second member laterally. Thereby, planar movement of the screen and the associated centering plates is effected.

The device also has an arm with an aperture for receiving and engaging a screen centering member. The member passes through the aperture and into engagement with a corresponding receptacle in the screen. Micro-adjusters associated with the support members are then manipulated so as to place the screen into precise registration with the article. A hole is made in each of the first and second plates at a location where the plates overlap. Upon passing a pin through the apertures, the reset or starting position for screen adjustment is defined.

The present invention is directed to a device for locating a printing screen at a selected starting position for its adjustment relative to an article, which comprises:
  first and second centering plates disposed in overlapping relationship to one another;
  the first plate being mounted to a screen support member moveable at least within the plane in which it lies and such that a pin receiving aperture in the first plate is alignable with a corresponding aperture in the second plate; whereupon alignment of the apertures and passage of a pin therethrough, the selected starting position is defined.

The present invention is further directed to a method for locating a printing screen at a selected starting position for printing operations and for resetting the screen to the starting position for adjustment relative to an article to be printed upon, which comprises the steps of:
  (a) positioning the screen at a selected position relative to the article, the screen having at least one receptacle for receiving a screen centering member;
  (b) aligning the receptacle with an aperture in an adjustable arm;
  (c) engaging the screen centering member with the receptacle and aperture;
  (d) perforating each of first and second centering plates disposed in overlapping relationship with one another;
  (e) passing a pin through the perforations so as to define the selected starting position;
  (f) removing the pin from the perforations;
  (g) performing at least one printing operation;
  (h) positioning a second article relative to the screen;
  (i) adjusting the centering plates so as to place the corresponding perforations in alignment with one another;
  (j) passing a pin through the perforations so as to define the selected starting position; and
  (k) performing at least one printing operation. Accordingly, it is an object of the present invention to provide a device which facilitates both increased production and improved quality of printed images.

Another object of the present invention is to readily position a printing screen at a selected location relative to a printing station, and thereafter reposition the screen at the location after printing.

Still another object of the present invention is to provide a device which quickly and simply effects precise registration of a printing screen with an article.

A further object of the present invention is to provide a device which facilitates precise adjustment of a printing screen relative to an article.

The present invention will now be further described by reference to the following drawings which are not to be deemed limitative in any manner thereof.

BRIEF DESCRIPTION OF THE DRAWINGS

The same numerals are used throughout the various figures of the drawings to designate similar parts.

Figure 1:
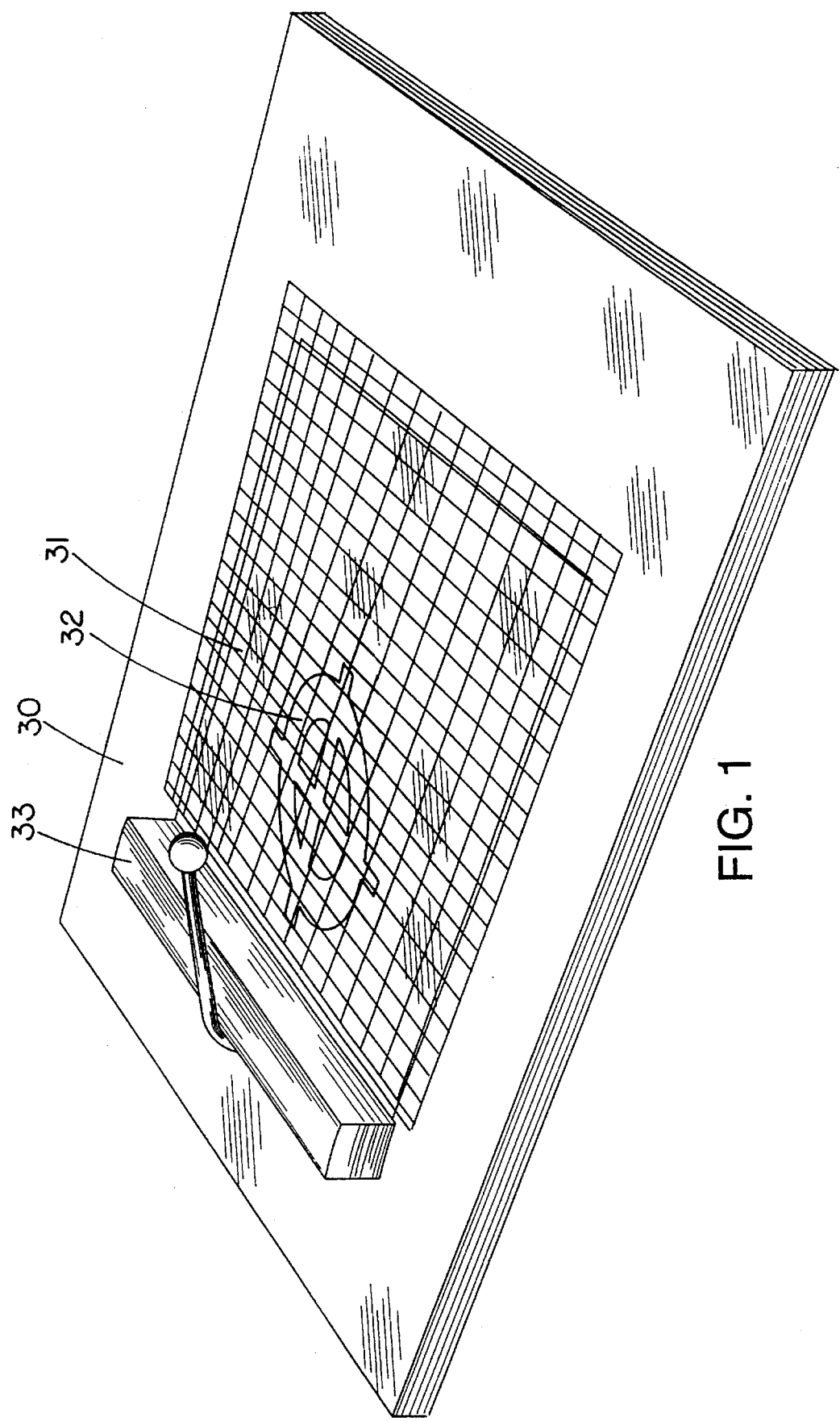
FIG. 1 is a perspective view of a registration grid, in accordance with one aspect of the present invention.

Still other objects and advantages of the present invention will become apparent from the following description of the preferred embodiments.

DETAILED DESCRIPTION OF THE PREFERRED EMBODIMENTS

FIGS. 1–12 illustrate generally a device 10 for locating a printing screen 20 at a selected starting position for its adjustment relative to an article. The device comprises first and second centering plates 11, 12 disposed in overlapping relationship to one another. The first plate is mounted to a first screen support member 22 moveable at least within the plane in which it lies and such that a pin receiving aperture 13 in the first plate is alignable with a corresponding aperture 14 in the second plate. Upon passage of pin 15 through the apertures, the selected starting position is defined.

The second centering plate is mounted to a second screen support member 21, the second support member being attached to a relatively stationary printing head support 23. Both centering plates are preferably disposed adjacent one side end of the printing head exterior.

Preliminary to installation of the screen, an overlay 31, e.g., of transparent plastic having a design 32 affixed thereto, is positioned on a zero registration grid 30, as shown in FIG. 1. The overlay is placed at a precise location on the grid which corresponds to the location on a pallet (or blanket) supported article upon which the design or image is to be printed. The grid preferably corresponds dimensionally to a printing pallet or other article support. A hole punch mechanism 33 along one side of the grid then engages the overlay, locating holes at the desired locations of the overlay.

Figure 2A:
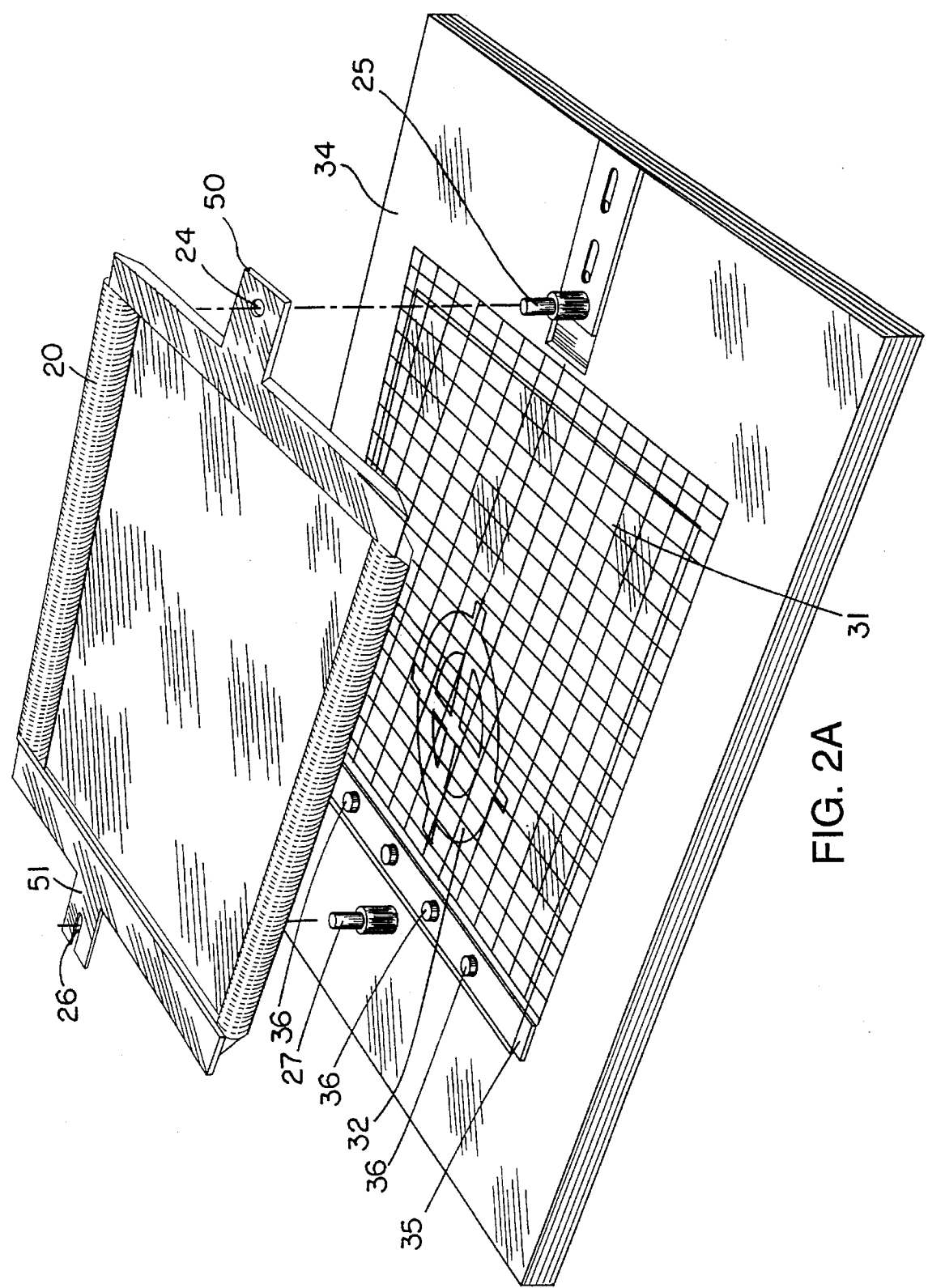
FIG. 2A is an exploded perspective view of a registration platform and printing screen assembly in accordance with one aspect of the present invention.
Figure 2B:
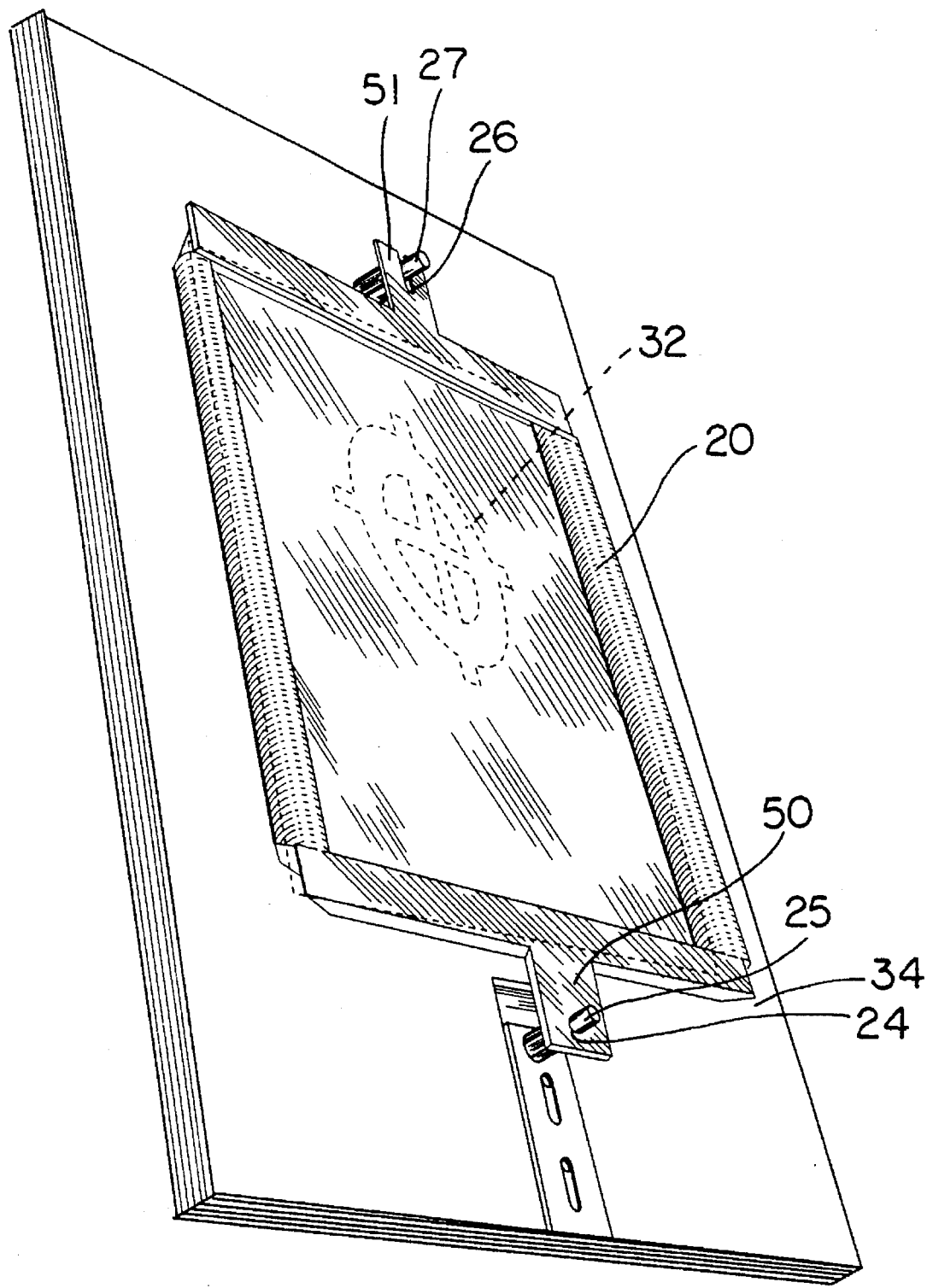
FIG. 2B is a perspective view of the assembly of FIG. 2A showing the printing screen mounted to the registration platform.

The overlay is next transferred to a zero registration board 34, as shown in FIG. 2A. An alignment strip 35 along one side end of the board has spaced apart projections 36, their spacing and dimensions corresponding to those of the holes punched in the overlay. The overlay is positioned on the board and the projections are engaged with the corresponding holes in the overlay. As shown in FIG. 2B, screen 20 is then placed over the overlay. A receptacle 24 at one end of the screen engages a first screen centering member 25 and a slot 26 at the other screen end slidably cooperates with a second screen centering member 27. Upon placing the screen atop the overlays, the overlays are adhered thereto by suitable fasteners, e.g., two sided adhesive tape.

The screen is then disengaged from the centering pins and removed from the zero registration board for the next stage of set-up known as "screen making". It will be understood by those skilled in the art that any process or means may be utilized for "screen making", giving consideration to the purpose for which the present invention is intended. Such "screen making" processes or means are known by those skilled in the art and further explanation is believed unnecessary for illustration of the present invention.

Figure 3:
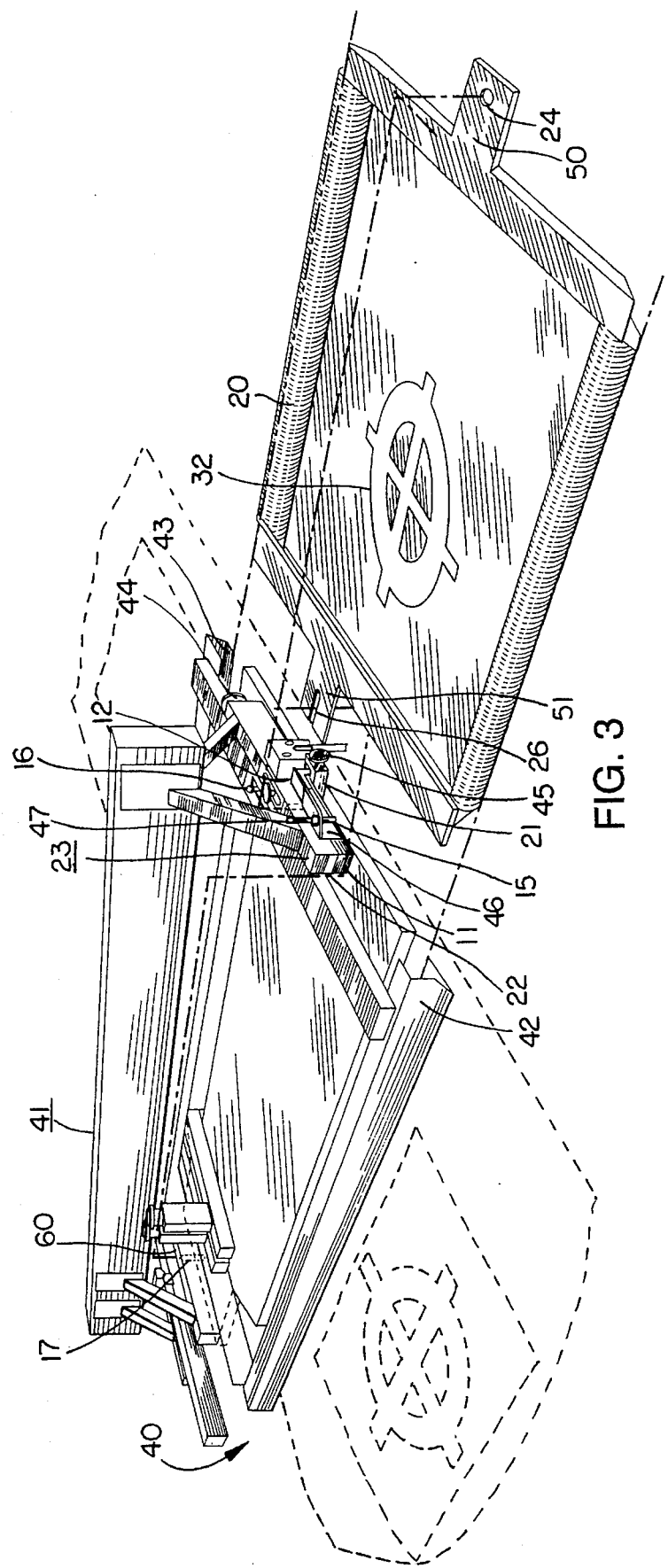
FIG. 3 is a perspective view of a printing apparatus embodying devices in accordance with one aspect of the present invention.

Thereafter, the screen is transferred to a printing station. For example, the screen slides into parallel guides 42, 43 of the printing station 40 beneath printing head 41, as shown in FIG. 3. Corresponding screen centering members or pins 16, 17 slide through apertures in arms 18, 19, respectively, and into engagement with receptacle 24 and slot 26, respectively, of the screen so that the screen is centered relative to the pallet supported articles just as it was on the zero registration board. Each screen centering member has a head generally wider than the member to prevent it from falling through the apertures.

Figure 4:
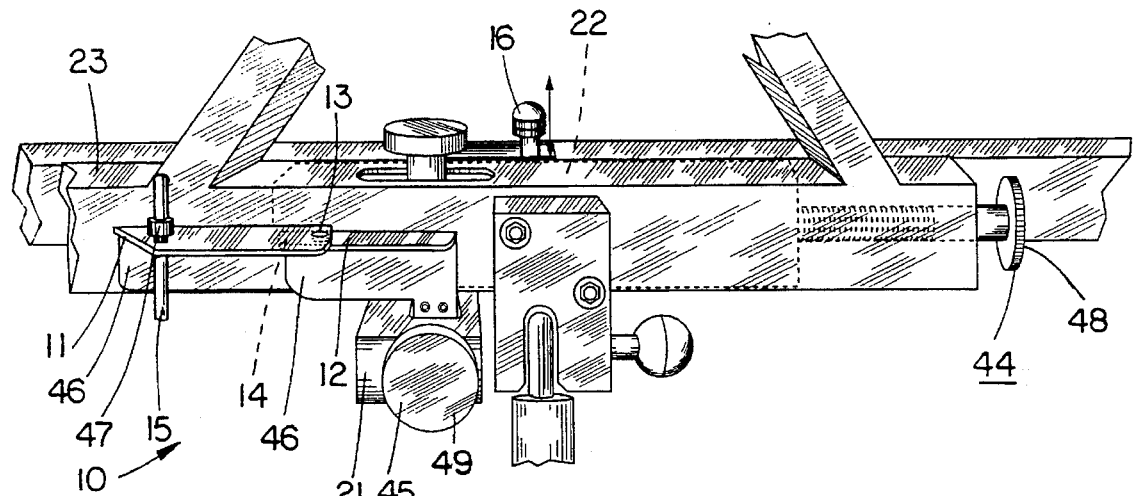
FIG. 4 is an enlarged perspective view of the outbound end device of FIG. 3.
Figure 5:
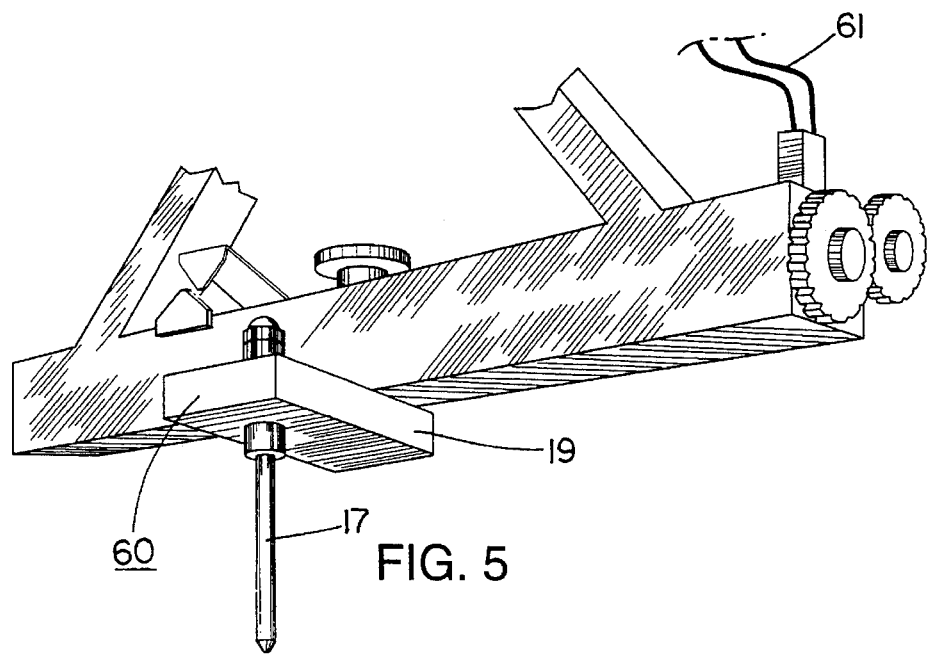
FIG. 5 is an enlarged perspective view of the inbound end device of FIG. 3.
Figure 6:
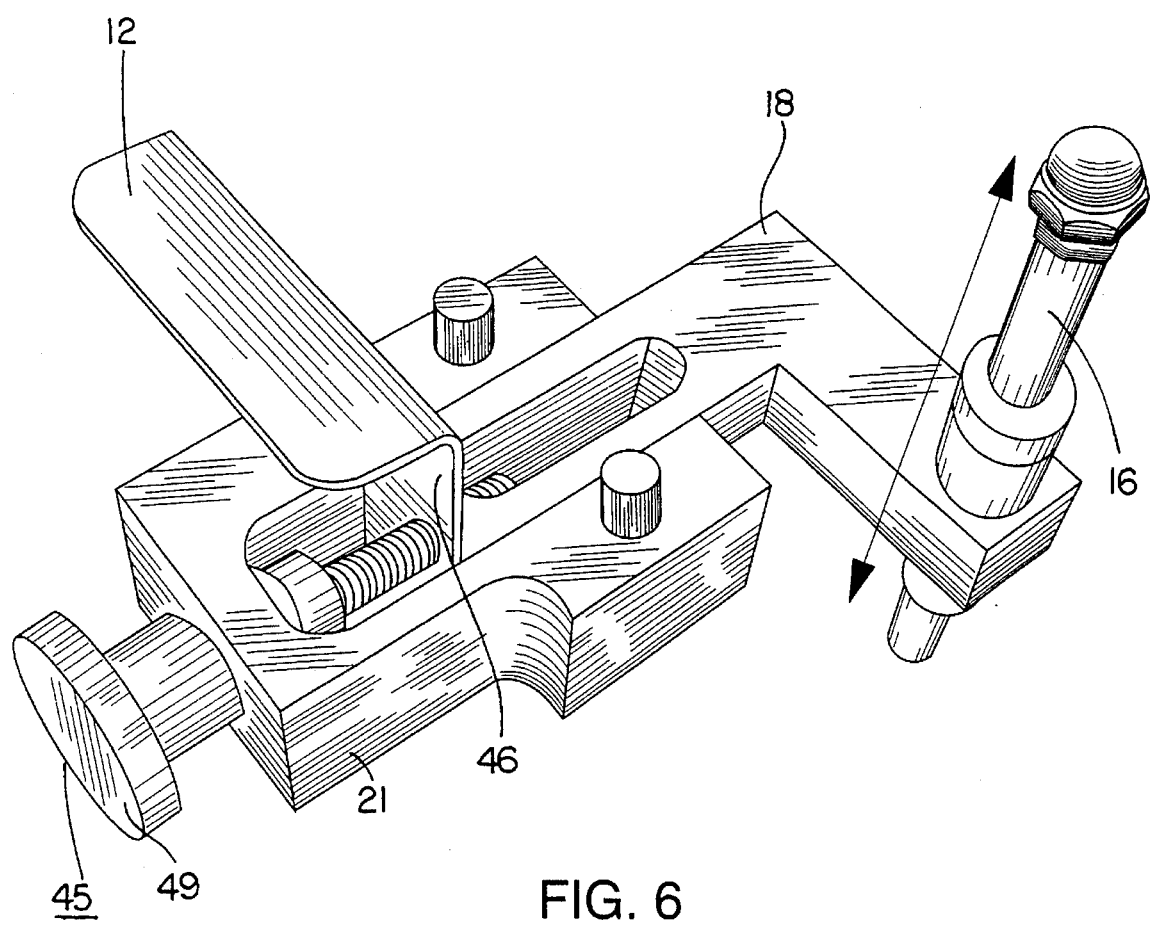
FIG. 6 is an enlarged perspective view of operative portions of the frontal device of FIG. 3.
Figure 8:
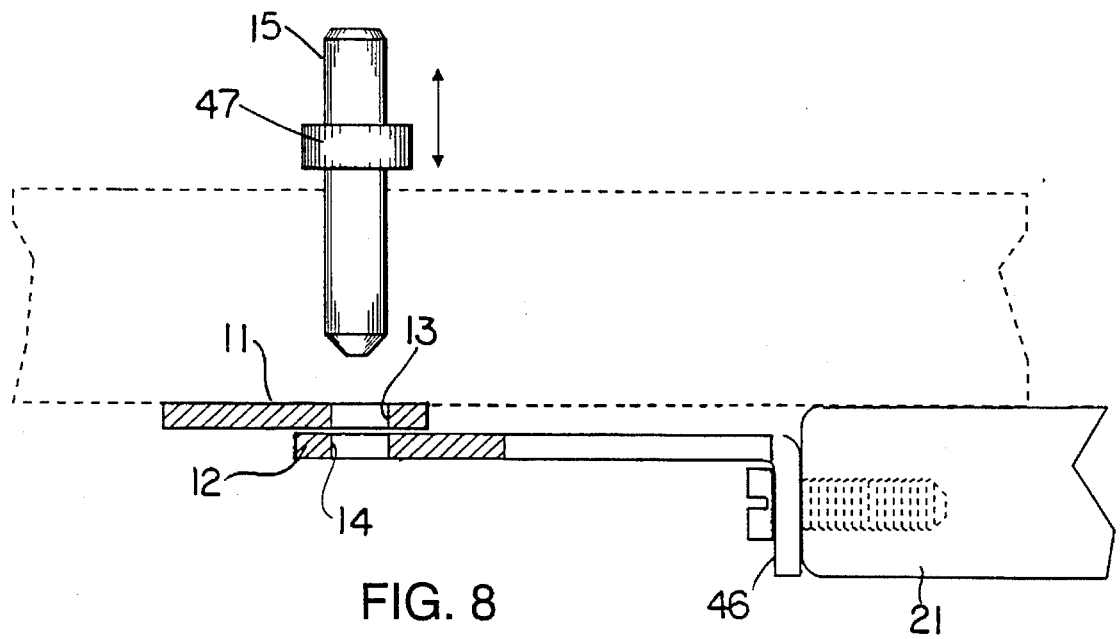
FIG. 8 is a sectional view of a device showing centering plates at the reset or starting position, in accordance with another aspect of the present invention.
Figure 8A:
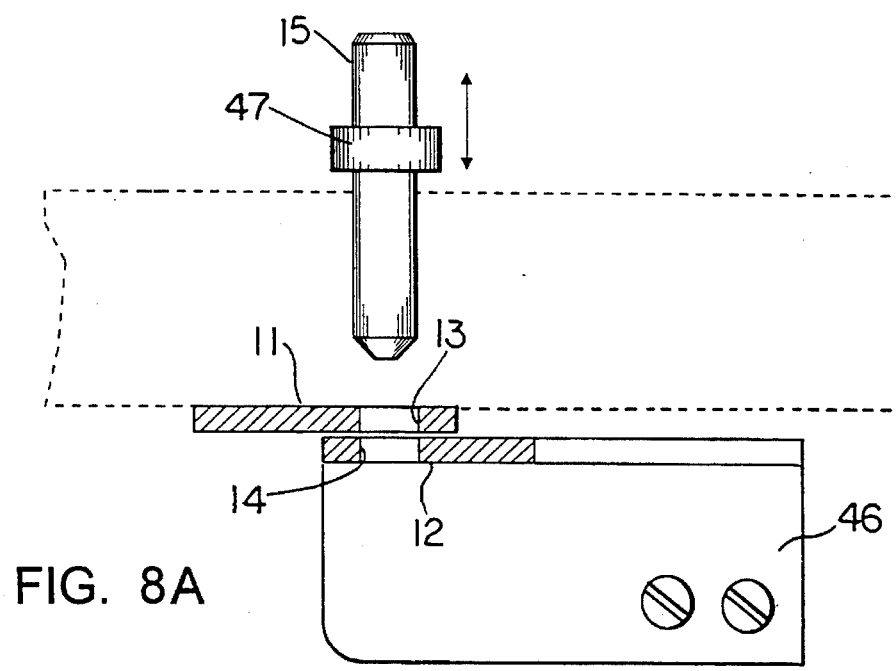
FIG. 8A is a sectional view of the device of FIG. 3 showing centering plates at the reset or starting position.

As best shown in FIGS. 4, 8 and 8A, perforations or apertures 13, 14 are then drilled through the respective first and second centering plates at a location where the plates overlap. Pin 15 is passed through the apertures to insure their precise alignment. The relative position of the plates and the screen defines both selected starting and reset positions of the device. The pin is then removed and placed in an aperture 28 in one of the centering plates to prevent its loss or damage.

Precise movement of the printing screen is effected by micro-adjustment means 44, 45 associated with the respective support members. The first means 44 effects longitudinal movement of the first member whereas the second means 45 effects movement of the second member laterally. This allows planar (X,Y) movement of the screen and associated centering plates. More particularly, each end of the screen is moved independently of the other, i.e., along its respective $X_1$ and $X_2$ axes.

Upon manipulation of the micro-adjustment means so as to place pin receiving aperture 13 of the first plate into alignment with corresponding aperture 14 in the second plate, and passage of pin 15 through both holes, as shown in FIG. 8, movement of the plates within their respective planes is significantly restricted. This defines the reset or starting position of screen adjustment.

Each centering plate is preferably comprised of a relatively flat, rigid sheet material, e.g., steel, and has a mounting portion 46 formed at one end for securement to its respective support member. Mounting is accomplished by suitable fasteners such as welding or bolts. Plate apertures 13, 14 are machined preferably to a close tolerance of the pin dimensions so as to provide a relatively tight, precise fit. It is also preferred that pin 15 be equipped with a flange 47 midway along its length to prevent it from falling through the aligned apertures.

Movement of the first centering plate relative to the second is effected, for example, by manipulation of micro-adjustment knobs 48; the knobs being rotatable either clockwise or counter-clockwise. In the present embodiment, first knob 48 effects longitudinal movement of the first moveable support member and hence the screen along its outbound end or $X_1$-axis. Movement of the second centering plate is effected in a like fashion by manipulation of a second rotatable micro-adjustment knob 49. Knob 49 effects screen movement along the screen y-axis. The objective initially is to align the apertures in both centering plates for reception of the pin, thereby zeroing (or resetting) the printing screen before adjustments are made. Return of the screen precisely to the same starting position each time adjustment is desired facilitates subsequent adjustment of the screen relative to and into precise registration with the article.

Extending from each side end of the screen is a mounting plate 50, 51. The respective plates are generally in an adjacent parallel plane to that of the screen. The first plate 50 (corresponding to the inbound side end of the screen) is pivotally secured to screen support member 21 by centering pin 16. The second plate 51 at the screen outbound side end is slotted for sliding reception of centering pin 17 associated with a second moveable screen support member 33.

Alternatively or concurrently therewith, a second device 60 of the present invention, like that described above, is provided at the inbound end of the screen. A corresponding second knob 48 (via gearing 61) effects longitudinal movement of corresponding second moveable screen support member 33 and hence the screen along its inbound end or $X_2$-axis. By aligning apertures in the corresponding centering plates and passage of a centering pin therethrough, the inbound screen end is reset to a second selected starting position for screen adjustment.

Although the screen is shown and described as adjustable in the X-Y plane, it will be understood by those skilled in the art that the present invention may be suitably modified for screen movement along or about other axes and in other planes giving consideration to the purpose for which this invention is intended.

Figure 7:
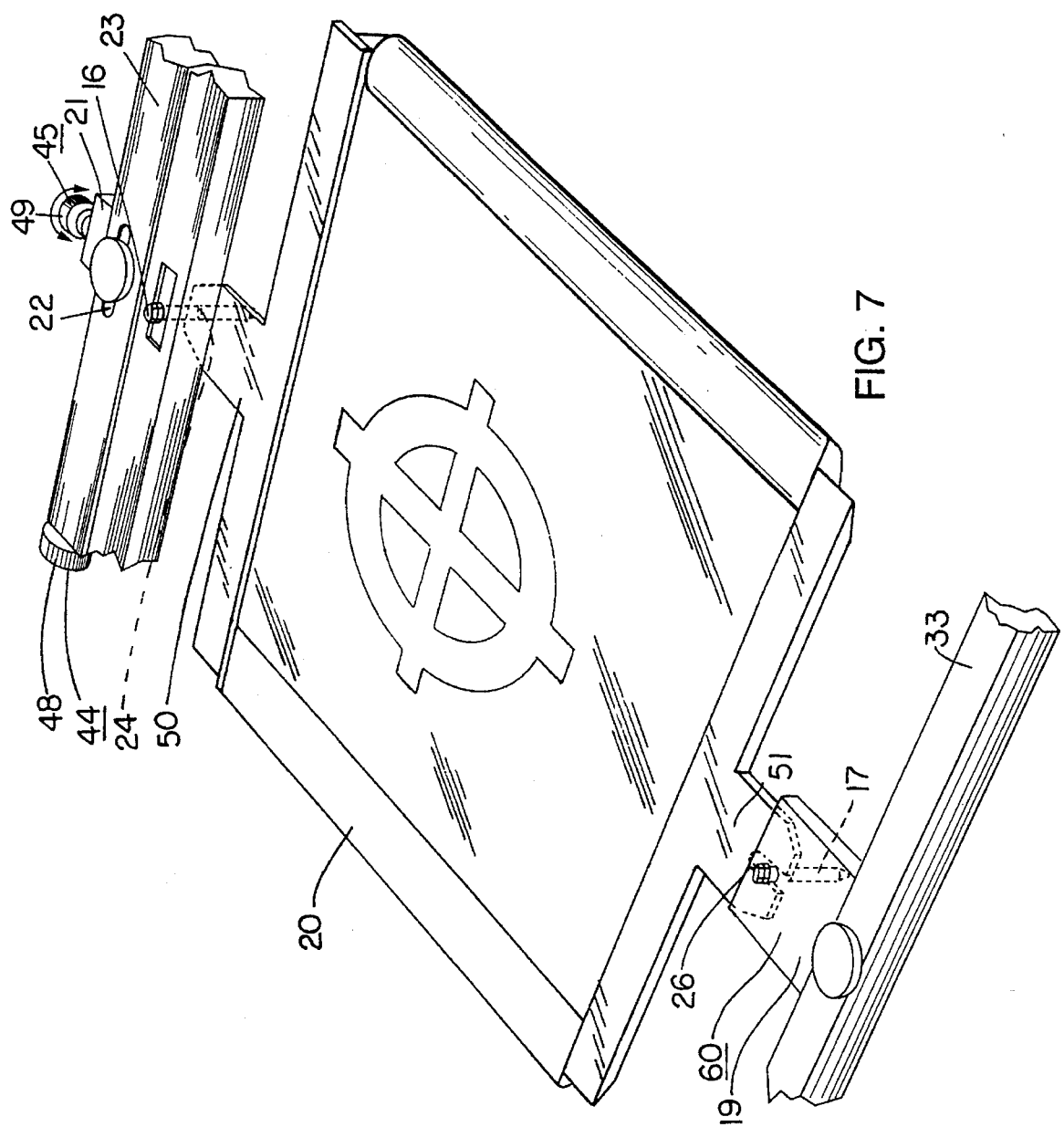
FIG. 7 is a perspective view of the printing screen of FIG. in the operative position.

In this manner, the inbound and outbound ends of the screen are adjusted and/or reset along their $X_1$ and $X_2$ axes, respectively, in accordance with the objectives of the present invention. The slot and pin arrangement of the second device, as shown in FIG. 7, also provides for placement of one end of the screen in a fixed position, while permitting ready removal of the screen for cleaning or replacement.

The present invention advantageously allows quick set-up of the printing screen for ready adjustment relative to and into precise registration with an article below. Whether adjustment becomes necessary due to offsetting of the article from the printing head, when changing designs, or during changes in apparatus dimensions due to variations in atmospheric temperature or other operating conditions, the present invention insures that the printing screen remains in precise registration with the article. The result is hastened set-up of the printing machine and a high degree of printing accuracy upon repetitive printing operations.

In operation, the printing screen is located at a selected starting position for adjustment relative to the article. Alternatively or concurrently therewith, adjustment is effected relative to an imaginary center-line of the printing pallet (or blanket).

Figure 10:
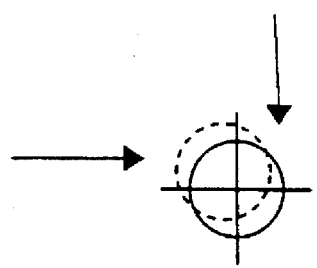
FIGS. 9 and 10 are diagrammatic representations of ranges of adjustment of the present invention.
Figure 9:
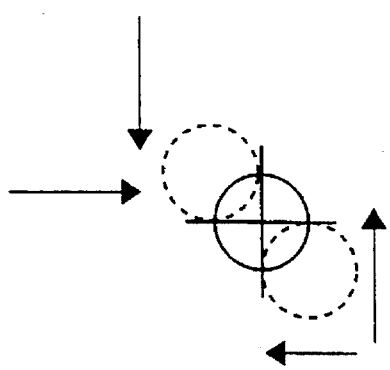

Each micro-adjustment knob is manipulated as appropriate to place the aperture in the first centering plate into alignment with the corresponding aperture in the overlapping second centering plate, as shown in FIGS. 8 and 8A. A representative range of aperture adjustment is shown in FIGS. 9 and 10. The pin is then passed through the apertures, restricting further movement of the centering plates within their respective planes. This defines the starting position for adjustment of the screen into precise registration with the article.

Figure 11:
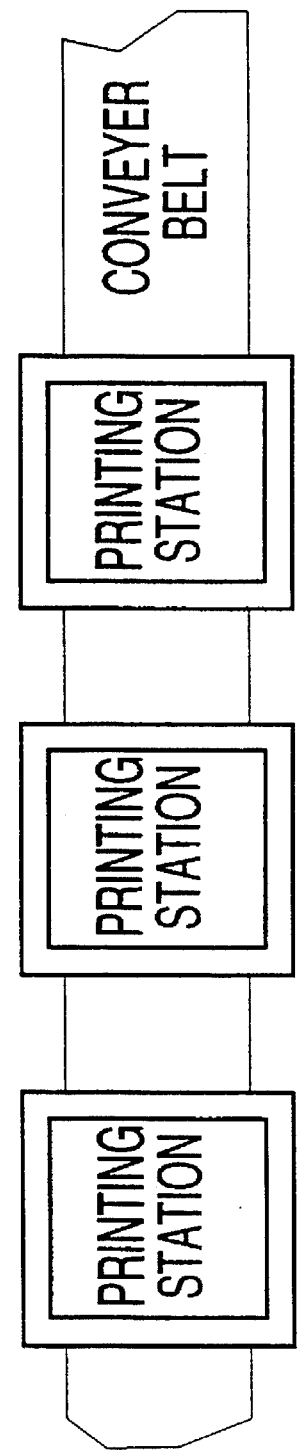
FIG. 11 is a diagrammatic representation of a conveyorized printing system in accordance with one aspect of the present invention.
Figure 12:
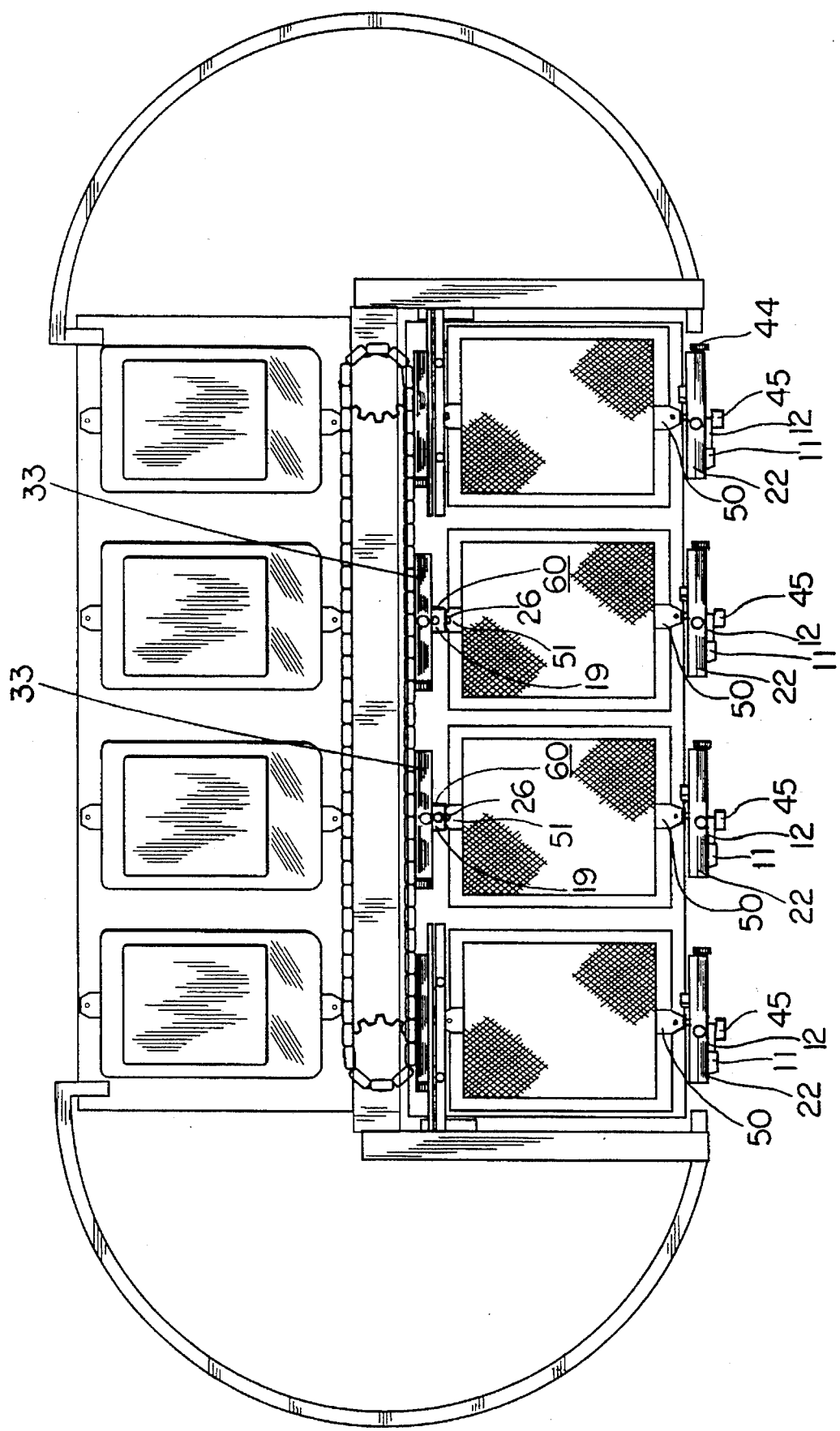
FIG. 12 is a plan view of an alternative apparatus incorporating the device of the present invention.

The embodiments illustrated involve application of the present invention to multi-step printing operations typically utilized in screen printing composite or multicolored images on articles, e.g., a component and/or color of the image being printed upon each step. As illustrated in FIGS. 3, 11 and 12, the device is also suitable for use in conjunction with printing pallet apparatus and conveyorized printing blanket systems. Apparatus of these general configurations are shown, for example, in U.S. Pat. Nos. 4,407,195, issued Oct. 4, 1983, and 5,022,320, issued Jun. 11, 1991, the disclosures of which are hereby incorporated by reference. However, application of the present invention to other printing systems, apparatus and/or methods is understood, giving consideration to the purpose for which the invention is intended.

In an alternative embodiment of the present invention, the centering plates are mounted to respective first and second moveable screen support members. In another alternative embodiment, the plates are oriented vertically or at an angle to the screen. Additional modifications may be resorted to without departing from the spirit and scope of the present invention.

Set-up of the present invention is done by first locating the screen at a selected position relative to the article. At each end of the screen, a screen centering member is then aligned and engaged with a corresponding receptacle of the screen and an aperture of the device arm. An aperture is made in each of the first and second centering plates at a location where both plates overlap one another and a pin is passed through the apertures. This defines the selected starting position. Thereafter, one or more printing operations are performed. Alternatively, the pin is removed from the apertures prior to or during printing operations.

After a second article is positioned relative to the screen, and the centering plates are adjusted so as to place their corresponding apertures in alignment with one another, the pin is again passed through the apertures, resetting the device to the starting position. One or more printing operations may again be performed, with or without the pins in engagement with the apertures.

Although the present invention is shown and described for use in conjunction with sheets of textiles or plastic, its application to other articles such as T-shirts, towels, place mats, pot holders, curtains and sheets will be understood by those skilled in the art, giving consideration to the purpose for which the present invention is intended.

Since from the foregoing the construction and advantages of the invention may be readily understood, further explanation is believed unnecessary. However, since numerous modifications will readily occur to those skilled in the art after consideration of the foregoing specification and accompanying drawings, it is not intended that the invention be limited to the exact construction shown and described, but all suitable modifications and equivalents may be resorted to which fall within the scope of the appended claims.

What is claimed is:

1. A method for locating a printing screen at a selected starting position for printing operations and for resetting the screen to the starting position for adjustment relative to an article to be printed upon, which comprises the steps of:
  (a) providing a first and a second centering plate disposed in overlapping relationship with one another;
  (b) providing a pin;
  (c) providing a screen centering member;
  (d) providing an adjustable arm having an aperture;
  (e) positioning the screen at a selected position relative to the article, the screen having at least one receptacle for receiving the screen centering member;
  (f) aligning the receptacle with the aperture in the adjustable arm;
  (g) engaging the screen centering member with the receptacle and aperture;
  (h) perforating each of the first and second centering plates disposed in overlapping relationship with one another;
  (i) passing the pin through the perforations so as to define the selected starting position;
  (j) removing the pin from the perforations;
  (k) performing at least one printing operation;
  (l) positioning a second article relative to the screen;
  (m) adjusting the centering plates so as to place the corresponding perforations in alignment with one another;
  (n) passing a pin through the perforations so as to define the selected starting position; and
  (o) performing at least one printing operation.

2. A method for locating a printing screen at a selected starting position for printing operations and for resetting the screen to the starting position for adjustment relative to an article to be printed upon, which comprises the steps of:
  (a) providing a first and a second centering plate disposed in overlapping relationship with one another;
  (b) providing a pin;
  (c) providing a screen centering member;
  (d) providing an adjustable arm having an aperture;
  (e) positioning the screen at a selected position relative to the article, the screen having at least one receptacle for receiving a screen centering member;
  (f) aligning the receptacle with the aperture in the adjustable arm;
  (g) engaging the screen centering member with the receptacle and aperture;
  (h) perforating each of the first and second centering plates disposed in overlapping relationship with one another;
  (i) passing the pin through the perforations so as to define the selected starting position;
  (j) removing the pin from the perforations;
  (k) performing at least one printing operation;
  (l) positioning a second article relative to the screen;
  (m) adjusting the centering plates so as to place the corresponding perforations in alignment with one another;
  (n) passing the pin through the perforations so as to define the selected starting position;
  (o) removing the pin from the perforations; and
  (p) performing at least one printing operation.

3. A system for locating a printing screen at a selected starting position for printing operations which comprises:
  a printing screen;
  an overlay;
  a registration grid for locating the overlay at a selected position on the screen;
  means for locating fasteners in the overlay;
  first and second screen centering members;
  a registration board for set-up of the overlay at the selected position, the board having fasteners adapted for engagement with the overlay and with the first and second screen centering members;
  the printing screen having a receptacle at one end and a slot at the other end for engaging the first and second centering members, respectively; and
  a device for locating the printing screen at the selected starting position and for resetting the screen to the starting position for adjustment relative to an article to be printed upon.

* * * * *